United States Patent
Stolze et al.

(10) Patent No.: US 8,586,420 B2
(45) Date of Patent: Nov. 19, 2013

(54) POWER SEMICONDUCTOR ARRANGEMENT AND METHOD FOR PRODUCING A POWER SEMICONDUCTOR ARRANGEMENT

(75) Inventors: Thilo Stolze, Arnsberg (DE); Guido Strotmann, Anröchte (DE); Karsten Guth, Soest (DE)

(73) Assignee: Infineon Technologies AG, Neubiberg (DE)

( * ) Notice: Subject to any disclaimer, the term of this patent is extended or adjusted under 35 U.S.C. 154(b) by 167 days.

(21) Appl. No.: 13/248,464

(22) Filed: Sep. 29, 2011

(65) Prior Publication Data

US 2013/0082387 A1    Apr. 4, 2013

(51) Int. Cl.
    H01L 21/00    (2006.01)

(52) U.S. Cl.
    USPC .... 438/124; 438/121; 438/667; 258/E23.068; 258/692; 258/773; 439/853; 439/857

(58) Field of Classification Search
    USPC .......... 257/E23.024, E21.577, E23.068, 177, 257/178, 180, 181, 692, 693, 696, 666, 667, 257/669, 670, 671, 771, 773; 438/121–124, 438/126, 127, 667; 439/853, 856, 857, 876
    See application file for complete search history.

(56) References Cited

U.S. PATENT DOCUMENTS

| 4,585,295 A * | 4/1986 | Ackerman ................... 439/857 |
| 5,199,879 A * | 4/1993 | Kohn et al. ................... 439/63 |
| 6,100,585 A * | 8/2000 | Chiba ........................... 257/734 |
| 6,483,128 B2 * | 11/2002 | Loddenkotter et al. ....... 257/177 |
| 6,858,807 B2 | 2/2005 | Ferber et al. |
| 7,656,672 B2 | 2/2010 | Schilling et al. |
| 7,816,781 B2 * | 10/2010 | Thoben et al. ................. 257/693 |
| 8,087,943 B2 * | 1/2012 | Stolze ............................ 439/83 |
| 8,203,205 B2 * | 6/2012 | Popp et al. .................... 257/687 |
| 8,258,618 B2 * | 9/2012 | Obiraki et al. ................ 257/697 |
| 8,299,601 B2 * | 10/2012 | Oka et al. ...................... 257/693 |

(Continued)

FOREIGN PATENT DOCUMENTS

| DE | 100 26 743 C1 | 1/2002 |
| DE | 103 43 821 A1 | 4/2005 |
| DE | 103 52 671 A1 | 6/2005 |
| DE | 10 2004 052 039 A1 | 5/2006 |
| DE | 100 08 572 B4 | 8/2007 |
| DE | 10 2008 058 003 A1 | 5/2010 |

OTHER PUBLICATIONS

Stolze, T. et al. "Reliability of PressFIT Connections", Power Conversion Intelligent Motion, May 27-29, 2008, Nuremberg, Germany.

(Continued)

*Primary Examiner* — Chris Chu
(74) *Attorney, Agent, or Firm* — Murphy, Bilak & Homiller, PLLC (57) ABSTRACT

In a method for producing a power semiconductor arrangement, an insulation carrier with a top side, a metallization, and a contact pin with a first end are provided. The metallization is attached to the top side and a target section of the metallization is determined. After the metallization is attached to the top side of the insulation carrier, the first end of the contact pin is pressed into the target section such that the first end is inserted in the target section. Thereby, an interference fit and an electrical connection are established between the first end of the contact pin and the target section of the metallization.

18 Claims, 9 Drawing Sheets

(56) References Cited

U.S. PATENT DOCUMENTS

| | | | |
|---|---|---|---|
| 8,299,603 B2 * | 10/2012 | Oka et al. | 257/697 |
| 8,446,726 B2 * | 5/2013 | Schloerke et al. | 361/704 |
| 2001/0025964 A1 | 10/2001 | Loddenkotter et al. | |
| 2007/0215999 A1 * | 9/2007 | Kashimoto et al. | 257/678 |
| 2007/0278669 A1 * | 12/2007 | Hierholzer et al. | 257/718 |
| 2009/0021916 A1 * | 1/2009 | Stolze | 361/709 |
| 2009/0194884 A1 * | 8/2009 | Stolze | 257/773 |
| 2010/0117219 A1 * | 5/2010 | Oka et al. | 257/693 |
| 2010/0127400 A1 | 5/2010 | Kanschat et al. | |
| 2013/0084679 A1 * | 4/2013 | Stolze et al. | 438/121 |

OTHER PUBLICATIONS

Bayerer, R. et al. "Higher Junction Temperature in Power Modules—a demand from hybrid cars, a potential for the next step increase in power density for various Variable Speed Drives", Power Conversion Intelligent Motion, May 27, 2008, Nuremberg, Germany.

* cited by examiner

POWER SEMICONDUCTOR ARRANGEMENT AND METHOD FOR PRODUCING A POWER SEMICONDUCTOR ARRANGEMENT

TECHNICAL FIELD

The invention relates to semiconductor arrangements.

BACKGROUND

In many power semiconductor arrangements, the internal and external electrical connection of the arrangement is realized by means of electrically conductive contact pins. However, soldering or welding such contact pins to a circuit carrier of the arrangement is cumbersome and often requires manual work. Therefore, there is a need for an improved power semiconductor arrangement and for an improved method for producing a power semiconductor arrangement.

SUMMARY

According to an embodiment of a method for producing a power semiconductor arrangement, an insulation carrier with a top side, a metallization and a contact pin with a first end are provided. The metallization is attached to the top side of the insulation carrier and a target section of the metallization is determined. The first end of the contact pin is pressed into the target section after the metallization is attached to the top side of the insulation carrier. Thereby, an interference fit and an electrical connection are established between the first end of the contact pin and the metallization.

According to another embodiment, a power semiconductor arrangement comprises an insulation carrier with a top side, a metallization attached to the top side, and a contact pin with a first end. The first end of the contact pin is inserted in a recess formed in a target section of the metallization.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
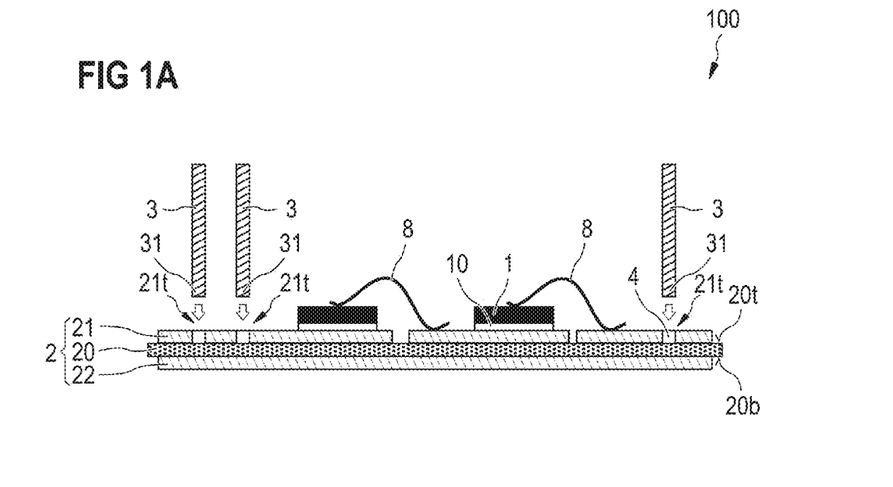
FIG. 1A is a cross-sectional view of a power semiconductor arrangement with a number of contact pins prior to being pressed into target sections of a metallization of an insulation carrier of the power semiconductor arrangement.
Figure 1B:
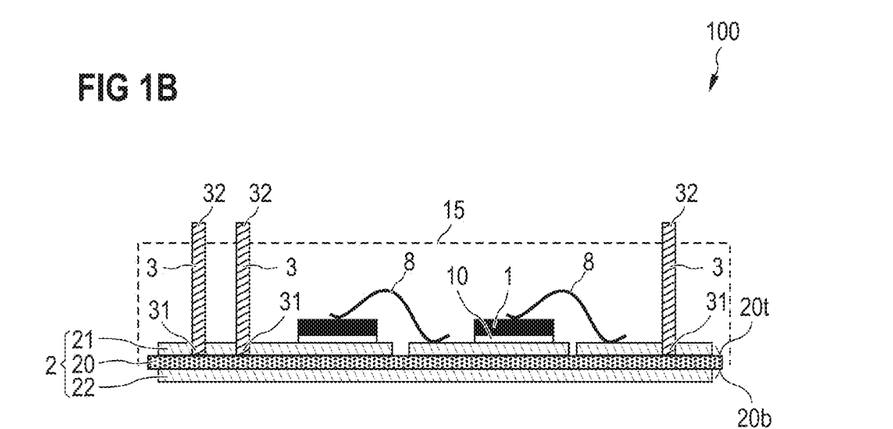
FIG. 1B is a cross-sectional view of the power semiconductor arrangement of FIG. 1A with the contact pins being pressed into the respective target section.

Referring now to FIG. 1 there is illustrated a power semiconductor arrangement 100 with a substrate 2. The substrate 2 includes an insulation carrier 20 with a top side 20t and a bottom side 20b, a top metallization 21 arranged on the top side 20t, and an optional bottom metallization 22 arranged on the bottom side 20b. The insulation carrier 20 is made of dielectric material, for instance of ceramics, plastics or any other electrically insulating material. In case of ceramics, the insulation carrier 20 may be made, e.g., of aluminum oxide (Al2O3, alumina), aluminum nitride (AlN), silicon nitride (Si3N4), zircon oxide (ZrO2), aluminum titanate (Al2TiO5), sintered silicon carbide (SSiC), or of reaction bonded silicone carbide (SiSiC).

Examples for suitable materials for the top metallization 21 and the optional bottom metallization 22 are copper, a copper alloy, aluminum, or an aluminum alloy. Generally, any electrically conductive material having a low specific resistance can be used. For example, the top metallization 21 and the optional bottom metallization 22 may be, independently from one another, made of copper or of a copper alloy with at least 90% by weight copper, or of aluminum or of an aluminum alloy with at least 90% by weight aluminum.

The substrate 2 serves as a carrier for an electronic circuit. So as to realize the electronic circuit, the top metallization 21 may be patterned in order to exhibit a number of conductive lines serving as electrical connections of the electronic circuit. In the example of FIG. 1, the electronic circuit includes at least one semiconductor chip 1 arranged on the top metallization 21. Such a power semiconductor chip 1 exhibits a pair of complementary main electrodes, for instance an anode and a cathode electrode, or a source and a drain electrode. Such a power semiconductor chip may be a vertical device with the complementary main electrodes arranged on opposing sides of the power semiconductor chip 1, or a lateral device with the complementary main electrodes arranged on the same side of the power semiconductor chip 1.

Optionally, at least one such power semiconductor chip 1 may be a controllable power semiconductor chip and accordingly have a control electrode which serves to control an electric current between the main electrodes of the chip 1, for example, to switch the electric current on and/or off, and/or to adjust an electric current between the pair of complementary main electrodes to values higher than a leakage current (about 0 A) when the controllable power semiconductor chip 1 is switched OFF) and lower than a maximum value when the controllable power semiconductor chip 1 is fully switched on.

Examples for suitable semiconductor chips 1 exhibiting a control electrode are FETs (field effect transistors), e.g. a MOSFETs (metal oxide semiconductor field effect transistors), IGBTs (insulated gate bipolar transistors), JFETs (junction field effect transistors), thyristors, etc. An example for a power semiconductor chip 1 without control electrode is a diode. In case of power semiconductor arrangements including two or more semiconductor chips 1, the electronic circuit may include any arbitrary combination of types of semiconductor chips 1.

Each semiconductor chip 1 may be joined to the top metallization 21 by means of a connection layer 10, for instance a solder, an electrically conductive adhesive, or a sinter layer comprising a noble metal like, for instance, silver. The connection layer 10 serves to mechanically join and to electrically connect the respective semiconductor chip 1 at its bottom side to the top metallization 21.

Optionally, the top side of the semiconductor chip 1 may be electrically connected by at least one connection means 8 to a section of the top metallization 21 or to another component of the power semiconductor arrangement 100. In the present example, the connection means 8 is a bonding wire. Alternatively, a connection means 8 may be a metal sheet or a metal ribbon which is bonded to the top side of the semiconductor chip 1. Bonding of the connection means 8 to the top side of the semiconductor chip 1 may take place, for instance, by wire bonding, by ultrasonic bonding, by soldering, by LTJT (low temperature joining technology), or by electrically conductive adhering.

The top metallization 21, the at least one semiconductor chip 1, and the optional at least one connection means 8 are elements of the electronic circuit. For instance, such an electronic circuit may form a single switch, a half bridge, an H-bridge, two, three or more half bridges, a matrix converter, a rectifier etc. In order to increase the ampacity of the electronic circuit, two or more power preferably identical semiconductor chips 1 may be connected parallel to one another.

So as to electrically connect the electronic circuit, e.g. to an arbitrary device relative to the power semiconductor arrangement 100, at least one electrically conductive contact pin 3 having a first end 31 is used. For each of the contact pins 3, a target section 21t of the metallization 21 is determined and the first end 31 of each contact pin 3 is pressed into the respective target section 21t. To this, a target section 21t may have a recess 4 for receiving the first end 31. According to the embodiment of FIG. 1A, such a recess 4 be formed as a through hole that completely protrudes the metallization 21 in the target section 21t. FIG. 1B shows the arrangement 100 after the insertion of the first ends 31 of all contact pins 3 into the respective recess 4 is completed.

In order to achieve a tight fit between the target section 21t and the contact pin 3, the recess 4 may have an undersize relative to the first end 31 so that material of the target section 21t is partially displaced by the first end 31 during the pressing ("press-fit"). This will be explained by way of example with reference to FIG. 2A which is a top view of a metallized substrate 2. The top metallization 21 includes a number of conductor lines spaced distant from one another. Six semiconductor chips 1 are arranged on the top metallization 21. On its side facing away from the substrate 2, each of the semiconductor chips 1 is provided with a main electrode 11 and with a control electrode 13. In other embodiments, the main electrode 11 and the control electrode 13 of at least one of the semiconductor chips 1 may be arranged on that side of the semiconductor chip 1 facing toward the substrate 2. Although there are shown six semiconductor chips 1 arranged on the substrate 2, the number of semiconductor chips 1 is arbitrary.

Figure 2A:
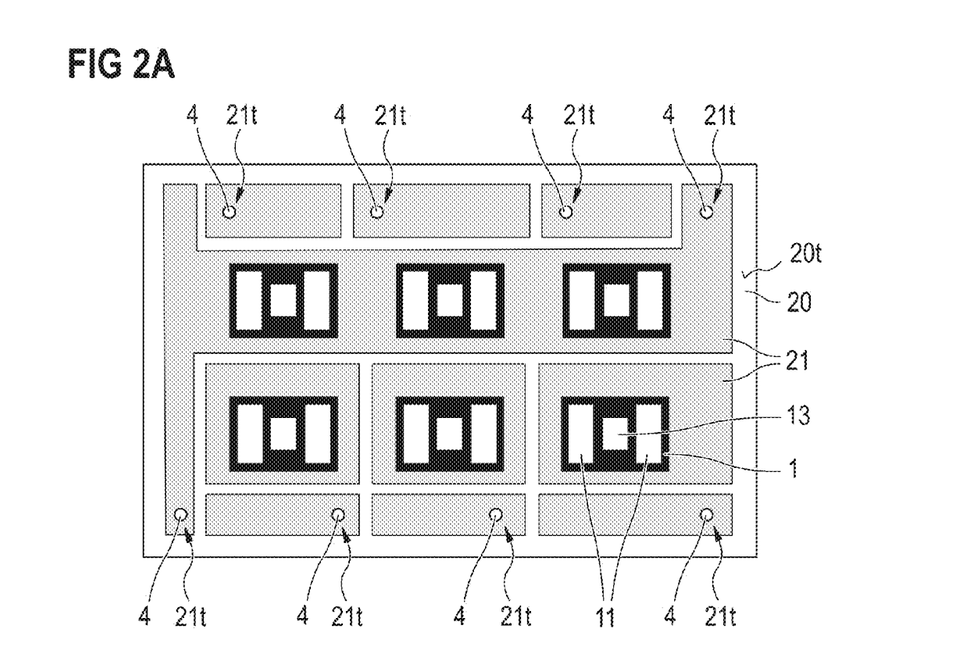
FIG. 2A is a top view of a metallized insulation carrier with recesses provided in the metallization.

In the top metallization 21, a number of recesses 4 are provided. The recesses 4 may protrude the top metallization 21 as already explained with reference to FIG. 1A. As shown in the embodiment of FIG. 2A, a recess 4 may have a circular cross section. However, cross sections shaped different than circular are also possible.

As is also illustrated in FIG. 1B, the power semiconductor arrangement 100 may have an optional housing 15 which is schematically illustrated by a dashed line in order to show that a contact pin 3 may have a second end 32 that penetrates the housing 15 so that the second end 32 is accessible from the exterior of the housing 15.

Figure 2B:
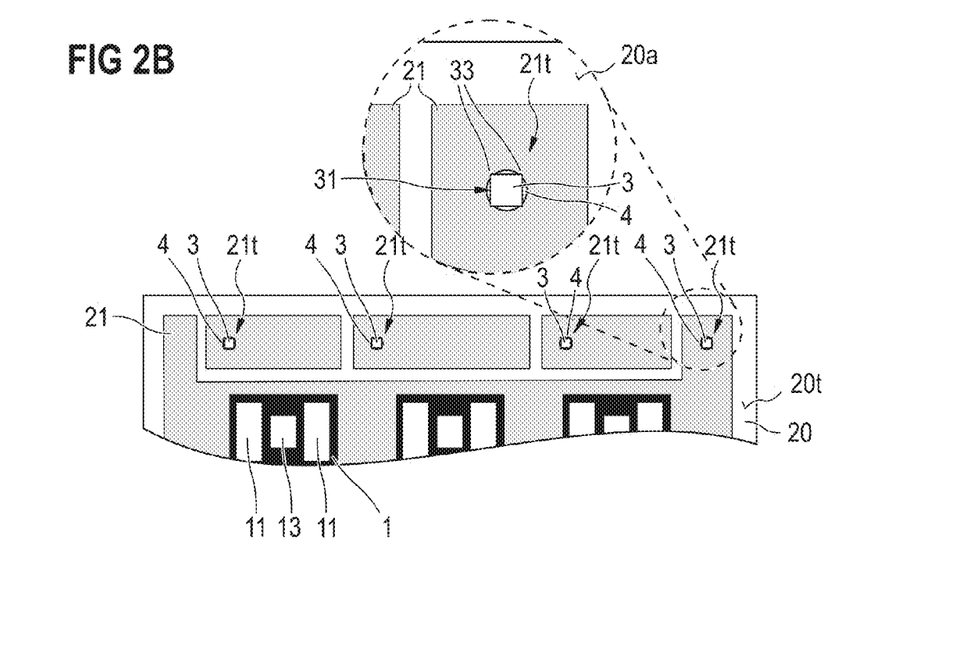
FIG. 2B is the top view of the metallized insulation carrier of FIG. 2A with first ends of contact pins inserted in the recesses.

FIG. 2B shows a section of the substrate 2 of FIG. 2A after the insertion of first ends 31 of contact pins 3 into the respective recesses 4. Prior to the insertion, the first ends 31 had an oversize relative to the respective recess 4. As is illustrated in an enlarged view for one of the recesses 4, a first end 31 may push parts of the top metallization 21 during insertion aside with the result that the inserted first end 31 is in direct physical contact with the respective target section 21$t$ and that at least one part of the first end 31 extends into a former region of the top metallization 21.

In the embodiment of FIG. 2B, the first ends 31 have approximately rectangular cross sections. As is can be seen, the corner regions 33 of the first ends 31 extend into former regions of the top metallization 21. Generally, the use of contact pins 3 having first ends 31 with rectangular cross sections is not required. Any other regular cross section, for instance a circular, triangular, pentagonal, hexagonal, octagonal, or irregular cross section is also possible.

Figure 3:
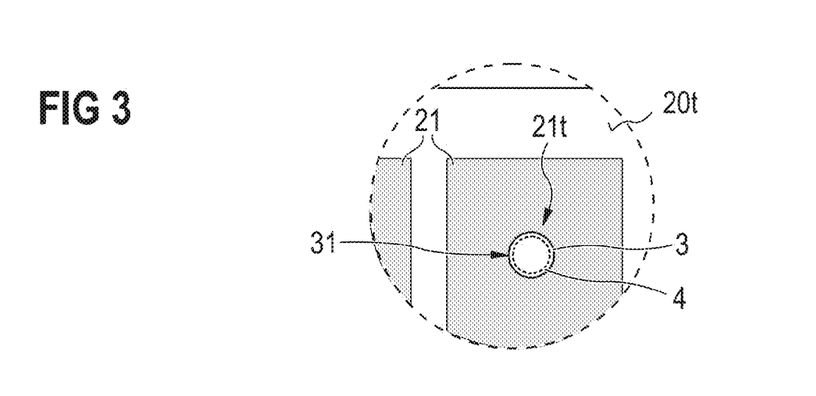
FIG. 3 is a top view of a metallized insulation carrier with a first end of a contact pin inserted in a recess, where the first end is in direct physical contact with the target section along a closed circumferential path.
Figure 4:
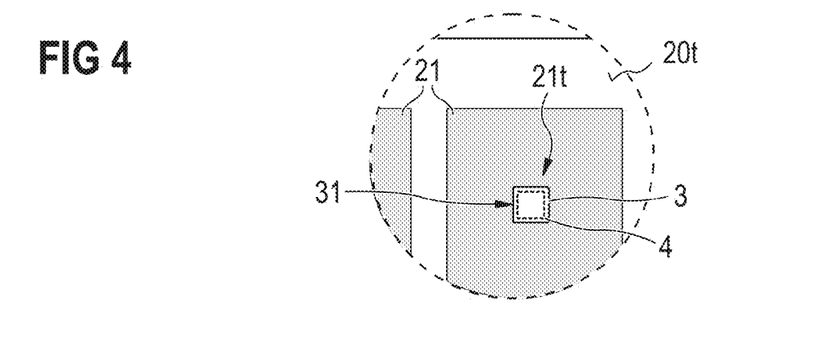
FIG. 4 shows an arrangement according to FIG. 3 with the difference that the closed circumferential path is approximately rectangular.

As illustrated in FIGS. 3 and 4, a first end 31 of a contact pin 3 inserted in a recess 4 may be in direct and continuous physical contact with the target section 21$t$ of the top metallization 21 along a closed circumferential path which in FIG. 3 is circular and in FIG. 4 is approximately rectangular. However, any other circumferential closed path different than circular and rectangular is also suitable. In both FIGS. 3 and 4, the position of the recess 4 prior to the insertion of the first end 31 is indicated by a dotted line.

Figure 5A:
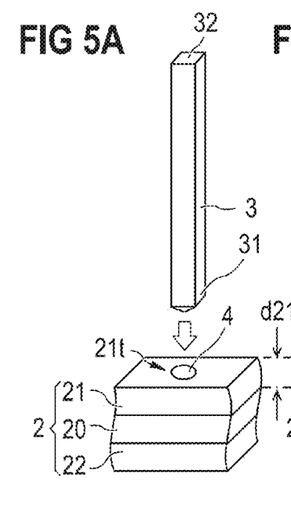
FIG. 5A is a perspective view of a contact pin having a first end prior to being pressed into a recess of a target section of the metallization of an insulation carrier.
Figure 5B:
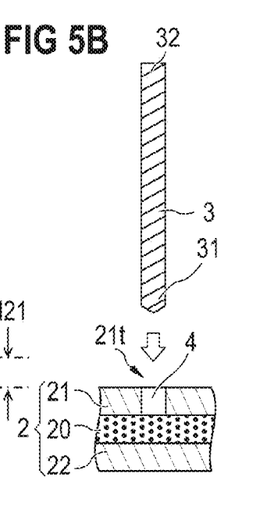
FIG. 5B is a cross-sectional view of the arrangement of FIG. 5A.
Figure 5C:
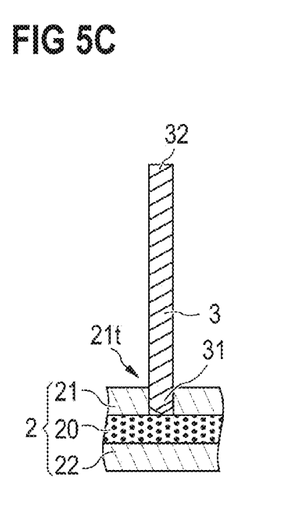
FIG. 5C is a cross-sectional view of the arrangement of FIGS. 5A and 5B with the first end being inserted in the recess of the metallization.

FIG. 5A is a perspective view and FIG. 5B a cross-sectional view of a contact pin 3 prior to being pressed into a recess 4 of a target section 21$t$ of the top metallization 21 attached to an insulation carrier 20. The first end 31 is tapered toward the recess 4 in order to facilitate the insertion. FIG. 5C which is a cross-sectional view according to FIG. 5B shows the arrangement with the first end 31 completely inserted in the recess 4 and electrically connected to the target section 21$t$. The established electrical connection between the contact pin 3 and the target section 21$t$ may be formed without subsequently soldering the contact pin 3 to the target section 21$t$, that is, the connection remains permanently solder-free.

Figure 6:
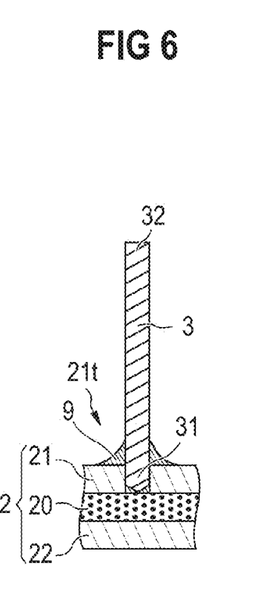
FIG. 6 is a cross-sectional view of the arrangement of FIG. 5C after the connection between the contact pin and the metallization is optionally secured by means of a solder.

Optionally however, an electrical connection between a contact pin 3 and a target section 21$t$ that has been formed by inserting a first end 31 of the contact pin 3 into the target section 21$t$ may be secured by additionally soldering or adhering the contact pin 3 to the target section 21$t$ using a solder or an adherent 9 as illustrated in FIG. 6. A solder or an electrically conductive adherent helps to reduce the electrical resistance of the connection. However, instead of an electrically conductive adherent, an electrically non-conductive adherent may be used as well.

Figure 7A:
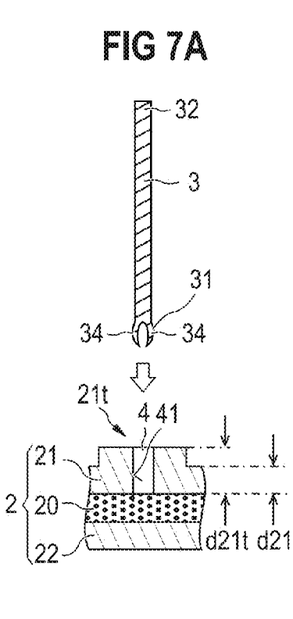
FIG. 7A is a perspective view of a contact pin exhibiting a bifurcated end prior to being pressed into a recess of the metallization of an insulation carrier.
Figure 7B:
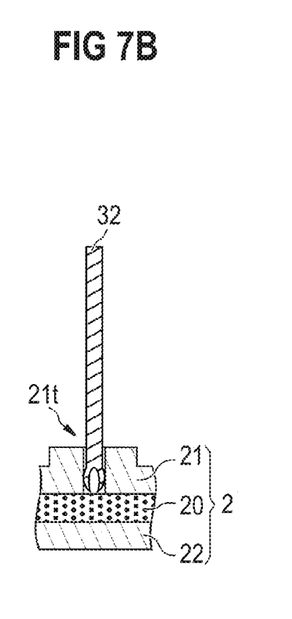
FIG. 7B shows the contact pin of FIG. 7A after being pressed into a recess of the metallization.

According to a further embodiment exemplary illustrated in FIGS. 7A and 7B, a first end 31 may be forked, e.g. bifurcated, so as to pre-tension the teeth 34 when the first end 31 is inserted into the recess 4. Due to the pre-tension, a reset force develops that presses the teeth 34 against the side wall 41 of the recess 4, thereby establishing a tight fit and an electrical connection between the contact pin 3 and the target section 21$t$.

According to a further embodiment also illustrated in FIGS. 7A and 7B, the thickness d21 of the top metallization 21 may be locally increased in the target section 21$t$, that is, the thickness d21$t$ of the target section 21$t$ exceeds the thickness the top metallization 21 has adjacent the target section 21$t$. A locally increased thickness of the top metallization 21 in the target section 21$t$ can also be used in connection with any contact pin 3 having a first end 31 that is not forked. Further a contact pin 3 having a first end 31 that is forked may also be used if the thickness of the target section 21$t$ is not locally increased.

Figure 8A:
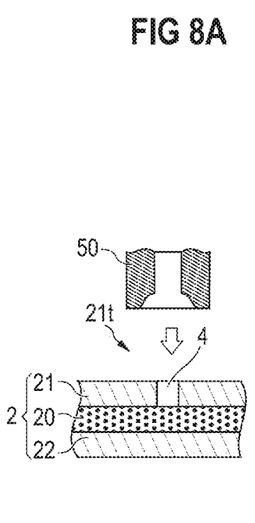
FIG. 8A is a cross-sectional view of an insulation carrier provided with a metallization prior to being locally embossed.
Figure 8B:
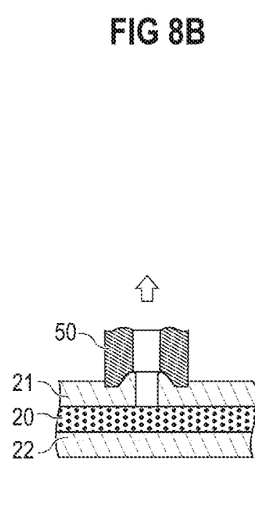
FIG. 8B shows the arrangement of FIG. 8A when being embossed by an embossing tool.
Figure 8C:
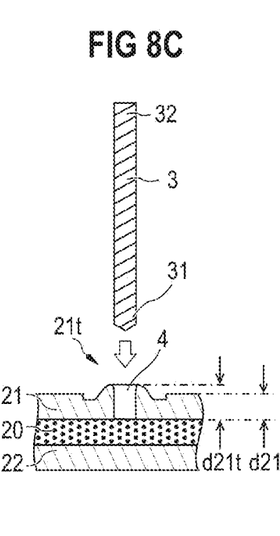
FIG. 8C shows the arrangement of FIG. 8B after the embossing tool is retracted from the metallization.

As illustrated with reference to FIG. 8A, a target section 21$t$ with locally increased thickness d21$t$ may be produced by embossing. To this, an embossing tool 50 may be pressed toward the top metallization 21 of a substrate 2 in a pre-defined target section 21$t$. Thereby, material of the top metallization 21 may be displaced into empty regions so that the thickness of the top metallization 21 is locally increased. As illustrated, embossing may take place after a recess 4 has been produced in the target section 21$t$. Alternatively, embossing may take place prior to or without forming a recess 4 in the target section 21$t$. After retracting the embossing tool 50 from the top metallization 21 (FIG. 8B), the first end 31 of a contact pin 3 may be pressed into the top metallization 21 as shown in FIG. 8C.

Figure 9A:
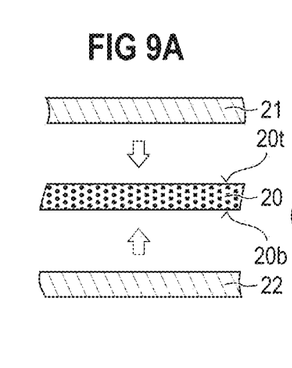
FIG. 9A is a cross-sectional view of an insulation carrier prior to being provided with a top metallization and a bottom metallization.
Figure 9B:
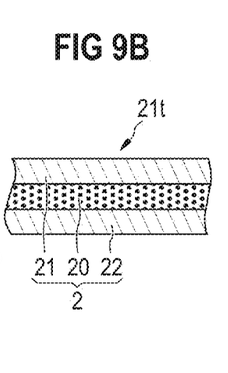
FIG. 9B shows the insulation carrier of FIG. 9A with the top and bottom metallizations attached.
Figure 9C:
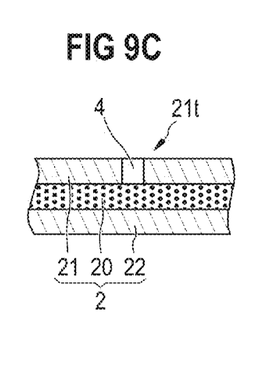
FIG. 9C shows the carrier of FIG. 9B after a recess has been produced in the top metallization.

In FIGS. 9A to 9C, it is illustrated that a substrate 2 having a recess 4 may be produced by first providing a top metallization 21 on the top side 20$t$ of an insulation carrier 20 (FIGS. 9A and 9B) and then producing a recess 4 in a target section 21$t$ of the attached top metallization 21 (FIG. 9C). For providing the top metallization 21 on the top side 20$t$ of the insulation carrier 20 any suitable technique, for instance direct copper bonding (DCB), active metal brazing (AMB), gluing etc., may be used. Subsequently, the recess 4 may be formed in the target section 21 by conventional techniques like masked etching, drilling, embossing etc. An optional bottom metallization 22 may be provided on the bottom side 20$b$ of the insulation carrier 20 prior to, simultaneously with or after providing the top metallization 21 onto the top side 20$t$.

Figure 10A:
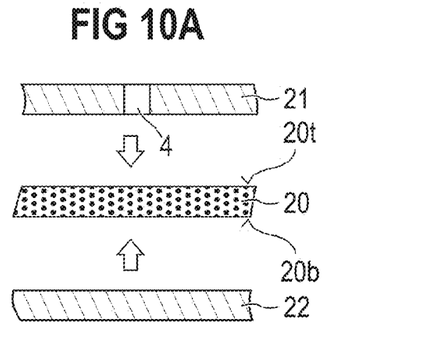
FIG. 10A is a cross-sectional view of an insulation carrier prior to being provided with a top metallization and a bottom metallization, the top metallization exhibiting a recess.
Figure 10B:
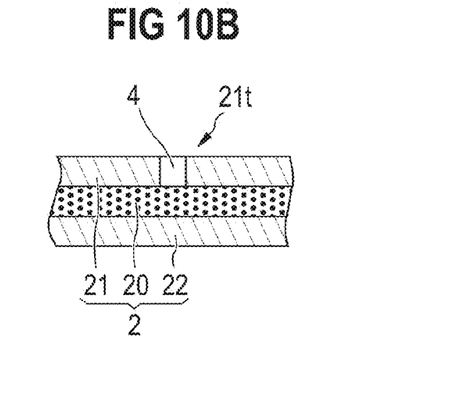
FIG. 10B is a cross-sectional view of the insulation carrier of FIG. 10A after the top and bottom metallizations are attached.

According to a modification illustrated in FIGS. 10A and 10B, a recess 4 in a target section 21$t$ of the top metallization 21 may be produced prior to attaching the top metallization 21, which may be a metal foil, onto the top side 20$t$ of the insulation carrier 20.

Figure 11A:
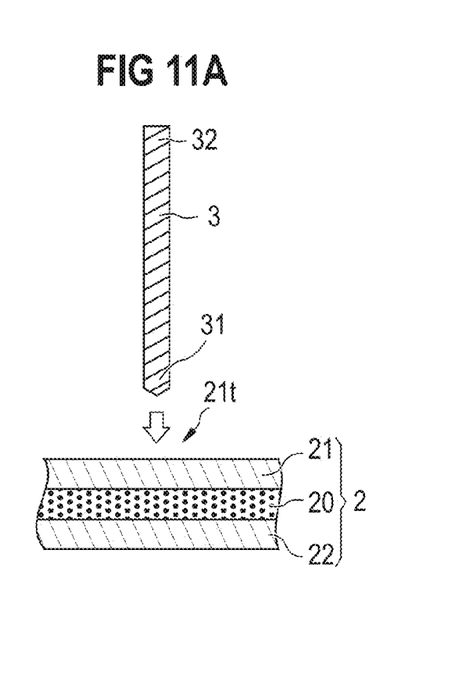
FIG. 11A is a cross-sectional view of a top and bottom metallization attached to an insulation carrier, and of a contact pin.
Figure 11B:
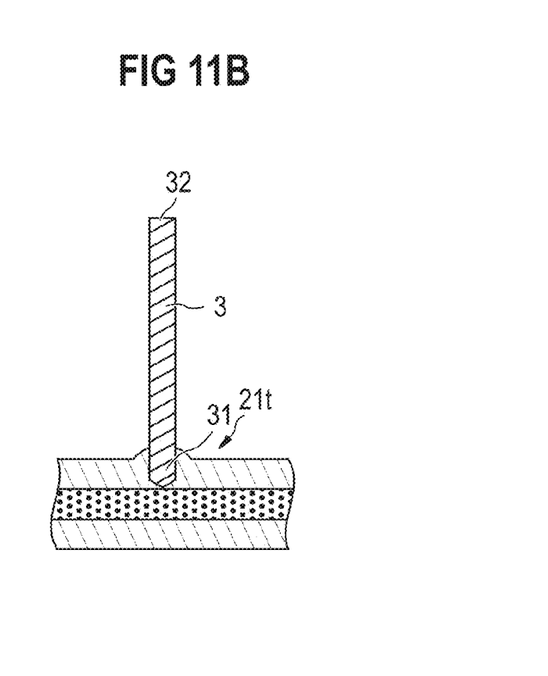
FIG. 11B shows the elements of FIG. 11A after an end of the contact pin is pressed into a target area of the top metallization without previously providing a recess in the target area.

According to a further embodiment illustrated in FIGS. 11A and 11B, the first end 31 of a contact pin 3 may be inserted into the top metallization 21 attached on the top side 20$t$ of an insulation carrier 20 without forming a recess prior to this. The first end 31 is pressed into the metal of the target section 21$t$, thereby displacing material from the target section 21$t$ which results in a local increase of the thickness of the top metallization 21 in the target area 21$t$.

In all embodiments explained above in which the top metallization 21 has a recess 4, the recess 4 is described as an opening completely protruding the top metallization 21, that is, as a through hole or via hole. Instead, in any such embodiment, the recess 4 may be a blind hole in the top metallization 21. In this connection, the terms "via hole", "through hole"

and "blind hole" relate to the top metallization 21, that is, a recess 4 is regarded as a "through hole" or "via hole" in top metallization 21 if it completely protrudes the top metallization 21 even if it is closed by an underlying insulation carrier 20. Accordingly, a recess 4 in the top metallization 21 is regarded as a "blind hole" if it does not completely protrude the top metallization 21.

Figure 12A:
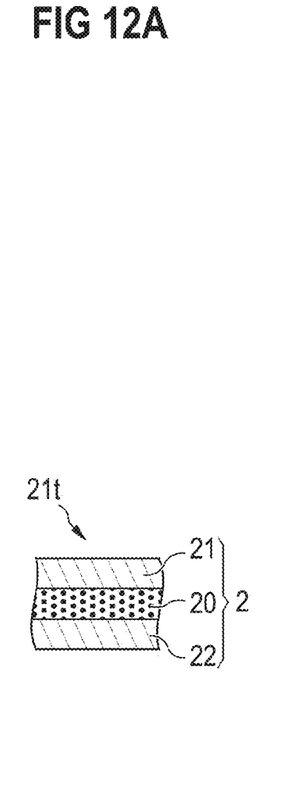
FIG. 12A is a cross-sectional view of an insulation carrier which is provided with a top metallization and a bottom metallization.
Figure 12B:
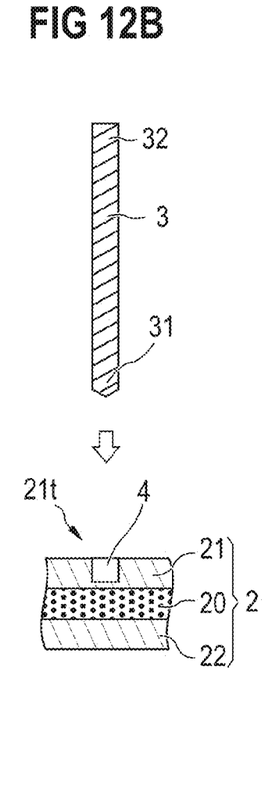
FIG. 12B shows the insulation carrier of FIG. 12A with a recess formed in a target section of the top metallization.
Figure 12C:
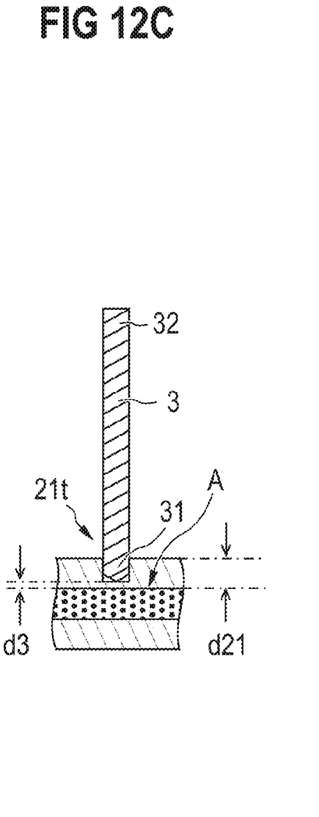
FIG. 12C shows the insulation carrier of FIG. 12B with an end of a contact pin inserted in the recess.

An example for a substrate 2 with a top metallization 21 having a recess 4 which is a blind hole is illustrated in FIGS. 12A to 12C. Such a substrate 2 may be produced in the same manner already described with reference to FIGS. 9A to 9C with the difference being that a blind hole instead of a through or via hole is produced on that side of the top metallization 21 facing away from the insulation carrier 20.

Figure 13A:
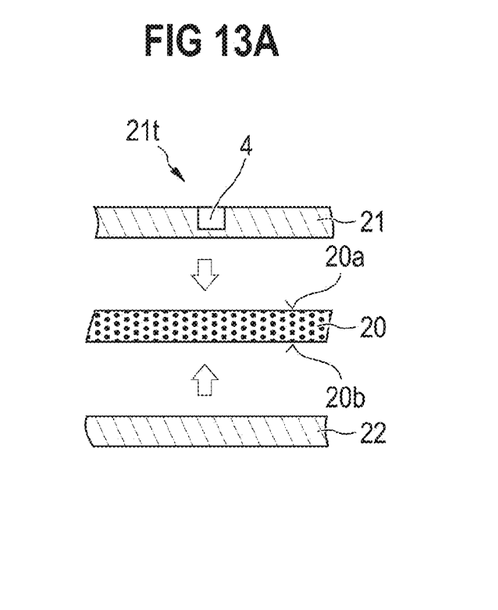
FIG. 13A is a cross-sectional view of an insulation carrier prior to being provided with a top metallization and a bottom metallization, the top metallization exhibiting a recess which is a blind hole.
Figure 13B:
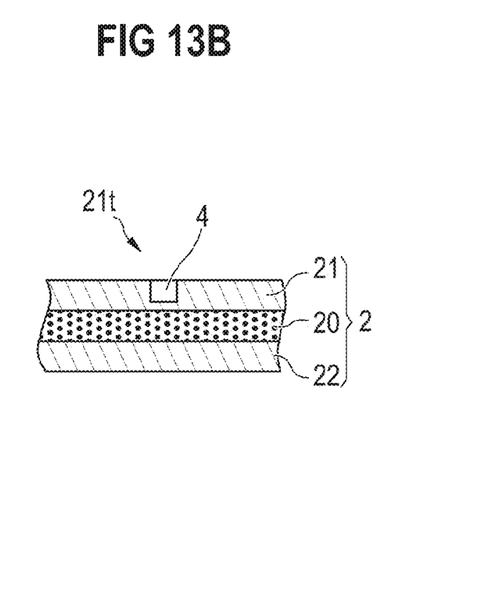
FIG. 13B is a cross-sectional view of the insulation carrier of FIG. 15A after the top and bottom metallizations are attached.

Alternatively, as illustrated in FIGS. 13A and 13B, such a substrate 2 may be produced in the same manner already described with reference to FIGS. 10A and 10B with the difference being that a blind hole instead of a through or via hole is produced on that side of the top metallization 21 facing away from the insulation carrier 20.

As illustrated in FIGS. 1B, 5C, 6, 7B and 11B, the first end 31 may be inserted into the target section 21t as far as the insulation carrier 20, that is, the target section 21t is in direct physical contact with the insulation carrier 20. However, in any embodiment exemplified with reference to FIGS. 1A to 11C, the insertion of the first end 31 into the target section 21t may be stopped before the first end 31 has reached the insulation carrier 20 such that the inserted first end 31 remains spaced distant from the insulation carrier 20. This may be useful if there is a risk of damaging the insulation carrier 20, for instance, if the insulation carrier 20 is made of a brittle material like ceramics. As illustrated in FIG. 12C, a recess 4 in the form of a blind hole may help to ensure that the inserted first end 31 remains spaced distant from the insulation carrier 20.

In the instant application, the distance between the contact pin 3 and the insulation carrier 20 is designated with d3. Generally, the distance d3 may be equal to zero or be greater than zero. For instance, the distance d3 may be smaller than or equal to 0.1 mm. Alternatively or in addition, the distance d3 may be greater than or equal to 0.1 mm.

Further, the distance d3 may be smaller than the average thickness <d21> of the top metallization 21 with the average thickness <d21> being defined as:

$$\langle d21 \rangle = \frac{1}{A} \cdot \int_A d21(\vec{r}) \cdot dA$$

where A is the area of contact between the top metallization 21 and the insulation carrier 20, $\vec{r}$ is a point of the area A, and $d21(\vec{r})$ is the local thickness of the top metallization 21 at the point $\vec{r}$. For instance, the average thickness <d21> may be at least 0.2 mm and/or less than or equal to 0.8 mm, less than or equal to 0.6 mm, or less than or equal to 0.5 mm.

According to one embodiment, the difference between the average thickness <d21> and the distance d3 may be at least 0.1 mm.

Then, the thickness of the insulation carrier 20 may range, e.g., from 0.2 mm to 1 mm, or from 0.2 mm to 2 mm. Generally however, the thickness of the insulation carrier 20 is arbitrary.

The above mentioned values, ranges, upper limits and lower limits for <d21>, d3 and the thickness of the insulation carrier 20 may be combined with one another arbitrarily as long as they are not inconsistent with each another.

Figure 14A:
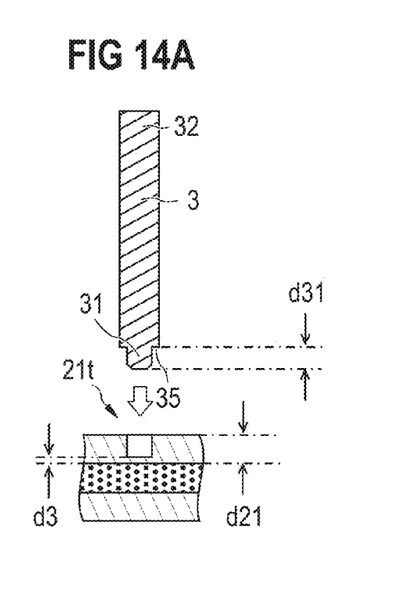
FIG. 14A shows an arrangement according to FIG. 12B wherein the contact pin has a mechanical stop.

According to a further embodiment illustrated in FIG. 14A, a contact pin 3 may have a mechanical stop 35 that is formed as a step. During insertion, such a mechanical stop 35 bears against the side of the top metallization 21 facing away from the insulation carrier 20. The length d31 of the first end 31 measured from the mechanical stop 35 in the direction of the insertion may be less than the average thickness <d21> of the top metallization 21 and/or less than the maximum thickness the target area 21t has prior to the insertion of the contact pin 3. After the insertion, between the first end 31 and the insulation carrier 20 a distance d3 remains that may have the same dimensions as explained above with reference to FIG. 12C.

Figure 14B:
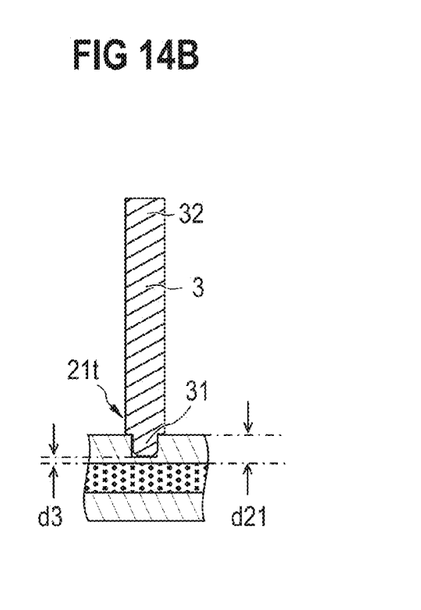
FIG. 14B shows the arrangement of FIG. 14A with the first end of the contact pin inserted in the recess.

The mechanical stop 35 may also serve to stop the insertion process before the first end 31 hits the insulation carrier 20. To this, the force required for inserting the first end 31 into the top metallization 21 depending on the insertion speed may be evaluated. As soon as the step 35 abuts against the top metallization 21, an increase of the required force will be observed. Hence, the insertion may be stopped if the force significantly increases, or if the force exceeds a pre-defined value. FIG. 14B shows the arrangement with the first end 31 completely inserted.

Figure 15A:
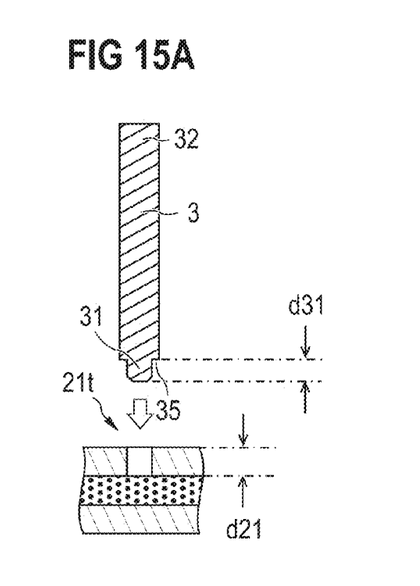
FIG. 15A shows the same arrangement as FIG. 14A with the difference that the recess completely protrudes the top metallization.
Figure 15B:
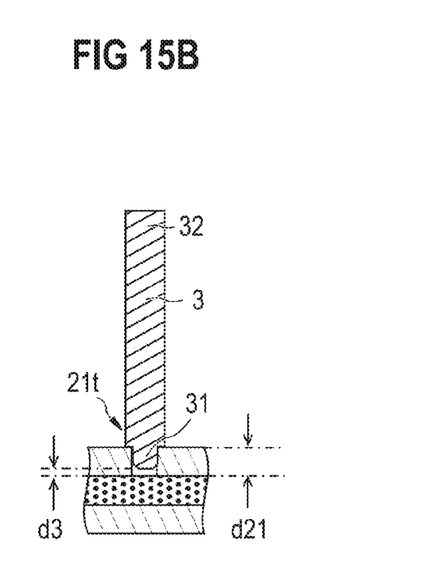
FIG. 15B shows the arrangement of FIG. 15A with the first end of the contact pin inserted in the recess.
Figure 16A:
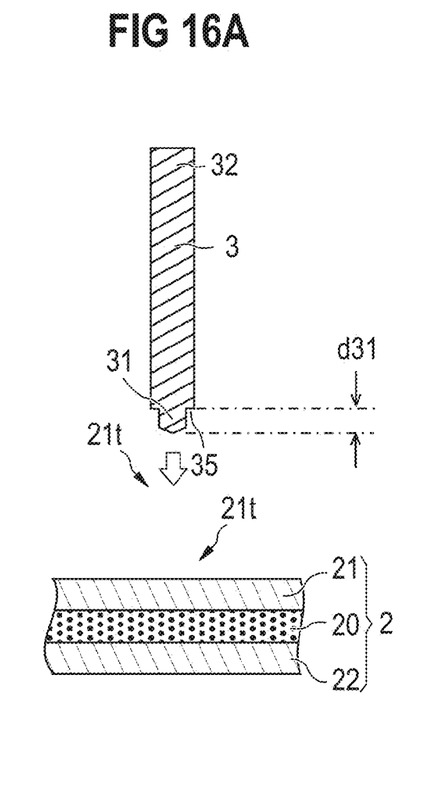
FIG. 16A shows the same arrangement as FIG. 11A with the difference that the contact pin has a mechanical stop.
Figure 16B:
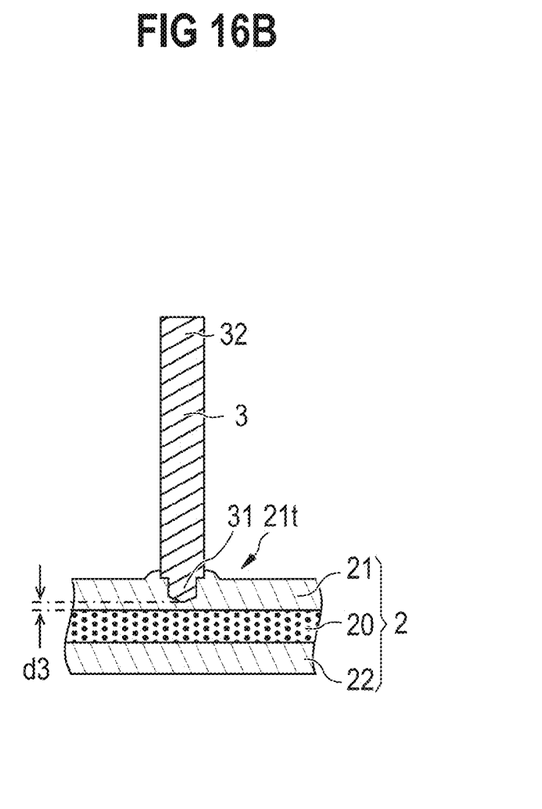
FIG. 16B shows the arrangement of FIG. 16A with the first end of the contact pin inserted in the top metallization.

In the arrangement of FIGS. 14A and 14B, the recess 4 is a blind hole. However, a contact pin 3 having a mechanical stop 35 may be inserted in the same way if the recess 4 completely protrudes the top metallization 21 as illustrated in FIGS. 15A and 15B, or if there is no recess in the target area 21t as illustrated in FIGS. 16A and 16B.

Any explained embodiment and in any variation thereof at least one semiconductor chip 1 may be arranged on and mounted to the top metallization 21 as exemplary explained with reference to FIGS. 1A, 1B, 2A and 2B. Thereby, the semiconductor chips 1 may be mounted prior to or after the insertion of the first end 31 into the top metallization 21.

Further in none of the embodiments the contact pin 3 is required to partly or completely penetrate the insulation carrier 20. After the insertion of the first end 31 is completed, the first end 31 and the top metallization 21 may be completely arranged on the same side of the insulation carrier 20.

Then, it is to be noted that the top metallization 21 may consist of a homogeneous material.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a power semiconductor arrangement, comprising:
   providing an insulation carrier with a top side;
   attaching a metallization to the top side of the insulation carrier;
   providing an electrically conductive contact pin having a first end;
   determining a target section of the metallization; and
   forming, after the metallization is attached to the top side of the insulation carrier, an electrical connection between the contact pin and the metallization by pressing the first end of the contact pin into the target section such that the first end is inserted in the target section, thereby establishing a press fit connection between the first end and the target section.

2. The method as claimed in claim 1, wherein after the electrical connection is formed, the metallization has an average thickness and a distance between the first end and the top side is less than the average thickness of the metallization.

3. The method as claimed in claim 1, wherein after the electrical connection is formed, a distance between the contact pin and the top side of the insulation carrier is less than 0.1 mm.

4. The method as claimed in claim 1, comprising forming, prior to or after the metallization is attached to the top side of the insulation carrier, a recess in the target section, the recess having an undersize relative to the first end of the contact pin, wherein the first end is pressed into the metallization by inserting the first end into the recess.

5. The method as claimed in claim 4, wherein the recess is produced by at least one of punching-out, embossing, drilling, and etching.

6. The method as claimed in claim 4, wherein the recess is formed as a hole completely protruding the metallization in the target section.

7. The method as claimed in claim 4, comprising forming, after the metallization is attached to the top side of the insulation carrier, the recess as a blind hole in the target section on the side of the target section facing away from the insulation carrier.

8. The method as claimed in claim 1, wherein the target section does not comprise a recess prior to the first end of the contact pin being pressed into the metallization.

9. The method as claimed in claim 1, wherein the first end of the contact pin is at least one of forked and tapered.

10. The method as claimed in claim 1, wherein a thickness of the metallization in the target section is locally increased by embossing.

11. The method as claimed in claim 1, wherein:
    the contact pin comprises a mechanical stop; and
    the pressing of the first end of the contact pin into the target section is stopped as soon as the mechanical stop abuts against a side of the metallization facing away from the insulation carrier.

12. The method as claimed in claim 1, wherein after the electrical connection is formed, the metallization has at least one of an average thickness of at least 100 µm and an average thickness of less than or equal to 600 µm.

13. The method as claimed in claim 1, wherein after the electrical connection is formed, the contact pin is in direct physical contact with the target section.

14. The method as claimed in claim 1, wherein the first end of the contact pin is soldered or adhered to the target section after the first end is pressed into the target section.

15. The method as claimed in claim 1, wherein the electrical connection between the contact pin and the target section is formed without subsequently soldering the contact pin to the target section so that the electrical connection remains solder-free.

16. The method as claimed in claim 1, wherein the metallization is made of copper, comprises at least 90% by weight copper, is made of aluminum, or comprises at least 90% by weight aluminum.

17. The method as claimed in claim 1, wherein the metallization consists of a homogeneous material.

18. The method as claimed in claim 1, wherein the insulation carrier is made of a ceramic material.

* * * * *

UNITED STATES PATENT AND TRADEMARK OFFICE
CERTIFICATE OF CORRECTION

| | | |
|---|---|---|
| PATENT NO. | : 8,586,420 B2 | Page 1 of 1 |
| APPLICATION NO. | : 13/248464 | |
| DATED | : November 19, 2013 | |
| INVENTOR(S) | : T. Stolze et al. | |

It is certified that error appears in the above-identified patent and that said Letters Patent is hereby corrected as shown below:

On Title Page (52) U.S. Cl., "258/E23.068" should be --257/E23.068--.

On Title Page (52) U.S. Cl., "258/692" should be --257/692--.

On Title Page (52) U.S. Cl., "258/773" should be --257/773--.

Signed and Sealed this
Eighteenth Day of February, 2014

Michelle K. Lee
*Deputy Director of the United States Patent and Trademark Office*